US012720874B2

(12) United States Patent
Noack et al.

(10) Patent No.: US 12,720,874 B2
(45) Date of Patent: Aug. 25, 2026

(54) GENERATION OF TEXTURED SURFACES, MANUFACTURING OF TANDEM SOLAR CELLS, AND TANDEM SOLAR CELL

(71) Applicant: SINGULUS TECHNOLOGIES AG, Kahl am Main (DE)

(72) Inventors: Philipp Noack, Maisach (DE); Bianca Wattenberg, Alling (DE); Mirza Corda, Maisach (DE); Benjamin Mandlmeier, Poecking (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 8 days.

(21) Appl. No.: 18/806,892

(22) Filed: Aug. 16, 2024

(65) Prior Publication Data

US 2025/0040257 A1 Jan. 30, 2025

Related U.S. Application Data

(63) Continuation of application No. PCT/EP2023/051247, filed on Jan. 19, 2023.

(30) Foreign Application Priority Data

Feb. 18, 2022 (DE) ......................... 102022201714.5

(51) Int. Cl.
*H10F 10/161* (2025.01)
*H10F 71/00* (2025.01)
*H10F 77/70* (2025.01)

(52) U.S. Cl.
CPC ......... *H10F 10/161* (2025.01); *H10F 71/121* (2025.01); *H10F 77/703* (2025.01)

(58) Field of Classification Search
CPC .... H10F 10/161; H10F 71/121; H10F 77/703; H10F 10/19
See application file for complete search history.

(56) References Cited

U.S. PATENT DOCUMENTS 4,137,123 A * 1/1979 Bailey ................... H10P 50/644 257/E31.13
6,224,713 B1 5/2001 Hembree et al.
(Continued)

FOREIGN PATENT DOCUMENTS

CN 105870263 A * 8/2016 ........... H10F 77/703
CN 209133464 U * 7/2019
(Continued)

OTHER PUBLICATIONS

Messmer, Christoph, et al. “The race for the best silicon bottom cell: Efficiency and cost evaluation of perovskite-silicon tandem solar cells.” Progress in Photovoltaics: Research and Applications 29.7 (2021): 744-759.

(Continued)

*Primary Examiner* — Laura M Menz
(74) *Attorney, Agent, or Firm* — Perry + Currier

(57) ABSTRACT

In a method for generating a textured surface of a semiconductor layer, a surface of the semiconductor layer is etched anisotropically with a first alkaline etching solution to generate a surface of the semiconductor layer including pyramid-shape textures. Subsequently, the surface including the pyramid-shaped textures is etched anisotropically with a second alkaline etching solution, which differs from the first alkaline etching solution, to cause material removal of the pyramid-shaped textures, thereby reducing a height difference between peaks and neighboring valleys of the pyramid-shaped textures. A method for manufacturing a tandem solar cell further includes generating a first solar cell structure of the tandem solar cell including the textured surface, and generating a second solar cell structure of the tandem solar cell on the side of the first solar cell structure on which the textured surface is arranged.

15 Claims, 6 Drawing Sheets

(56) References Cited

U.S. PATENT DOCUMENTS

| | | | | |
|---|---|---|---|---|
| 8,835,210 | B2 * | 9/2014 | Nakai | H10F 10/166 438/71 |
| 9,871,161 | B2 * | 1/2018 | Uto | H10F 71/103 |
| 2009/0280597 | A1 * | 11/2009 | Wijekoon | H10F 10/174 156/345.16 |
| 2012/0085397 | A1 * | 4/2012 | Kim | H10F 77/703 136/255 |
| 2012/0295447 | A1 * | 11/2012 | Tamboli | H10F 71/121 516/200 |
| 2018/0158976 | A1 * | 6/2018 | Ahn | H10F 10/19 |
| 2020/0343404 | A1 * | 10/2020 | Lee | H10F 71/139 |
| 2021/0005832 | A1 * | 1/2021 | Lee | H10F 71/121 |
| 2021/0126147 | A1 * | 4/2021 | Lee | H10K 85/50 |
| 2023/0144354 | A1 * | 5/2023 | Wu | H10F 10/19 136/255 |
| 2023/0246118 | A1 * | 8/2023 | Mandlmeier | H10F 10/166 136/258 |
| 2025/0040257 | A1 * | 1/2025 | Noack | H10F 10/19 |

FOREIGN PATENT DOCUMENTS

| | | | | | |
|---|---|---|---|---|---|
| CN | 109524487 | B | * | 11/2020 | H10F 71/121 |
| CN | 110299422 | B | * | 5/2021 | H10F 77/211 |
| CN | 109427930 | B | * | 2/2022 | H10P 50/00 |
| CN | 114203855 | A | * | 3/2022 | H10F 77/7003 |
| CN | 117293206 | A | * | 12/2023 | H10F 71/00 |
| CN | 118522792 | A | * | 8/2024 | H10F 71/00 |
| CN | 119317237 | A | * | 1/2025 | H10P 14/24 |
| CN | 119421566 | A | * | 2/2025 | |
| CN | 119452759 | A | * | 2/2025 | H10F 71/121 |
| CN | 120076462 | A | * | 5/2025 | H10F 10/14 |
| CN | 121510734 | A | * | 2/2026 | |
| CN | 121538711 | A | * | 2/2026 | |
| DE | 102022201714 | A1 | * | 8/2023 | H10F 71/121 |
| EP | 2717321 | A1 | * | 4/2014 | H10F 10/166 |
| EP | 3633736 | A1 | | 4/2020 | |
| EP | 3739637 | A1 | * | 11/2020 | H10F 71/121 |
| EP | 3840060 | A1 | * | 6/2021 | H10F 71/121 |
| EP | 3840060 | B1 | * | 6/2024 | H10F 71/121 |
| EP | 4480010 | B1 | * | 9/2025 | H10F 1/121 |
| FR | 3034255 | A1 | * | 9/2016 | H10F 71/121 |
| FR | 3105583 | A1 | * | 6/2021 | H10F 71/121 |
| KR | 101254565 | B1 | * | 4/2013 | H10F 77/707 |
| KR | 102541379 | B1 | * | 6/2023 | H10K 85/50 |
| WO | WO-2012165288 | A1 | * | 12/2012 | H10F 10/166 |
| WO | WO-2013089641 | A1 | * | 6/2013 | H10F 77/703 |
| WO | WO-2019182316 | A1 | * | 9/2019 | H10P 50/642 |
| WO | WO-2020228904 | A1 | | 11/2020 | |
| WO | WO-2021030491 | A1 | * | 2/2021 | H01G 9/2009 |
| WO | WO-2023156123 | A1 | * | 8/2023 | H10F 71/121 |

OTHER PUBLICATIONS

Sahli, Florent, et al. "Fully textured monolithic perovskite/silicon tandem solar cells with 25.2% power conversion efficiency." Nature Materials 17.9 (2018): 820-826.

Wang, Fengyou, et al. "Pyramidal texturing of silicon surface via inorganic-organic hybrid alkaline liquor for heterojunction solar cells." Journal of Power Sources 293 (2015): 698-705.

Du, Junlin, et al. "Selective rounding for pyramid peaks and valleys improves the performance of SHJ solar cells." Energy Science & Engineering 9.9 (2021): 1306-1312.

Mohr, Lena, et al. "Numerical simulation of an ozone-based wet-chemical etching." AIP Conference Proceedings. vol. 2147. No. 1. AIP Publishing, 2019.

Papet, P., et al. "Pyramidal texturing of silicon solar cell with TMAH chemical anisotropic etching." Solar Energy Materials and Solar Cells 90.15 (2006): 2319-2328.

* cited by examiner

GENERATION OF TEXTURED SURFACES, MANUFACTURING OF TANDEM SOLAR CELLS, AND TANDEM SOLAR CELL

CROSS-REFERENCES TO RELATED APPLICATIONS

This application is a continuation of copending International Application No. PCT/EP2023/051247, filed Jan. 19, 2023, which is incorporated herein by reference in its entirety, and additionally claims priority from German Application No. 10 2022 201 714.5, filed Feb. 18, 2022, which is incorporated herein by reference in its entirety.

The present invention concerns a method for generating a textured surface of a semiconductor layer, a method for manufacturing tandem solar cells with such a textured surface, and tandem solar cells manufactured by such methods.

BACKGROUND OF THE INVENTION

In solar cells, the surface of semiconductor wafers, in particular silicon wafers, is usually textured so as to decrease the reflectance (degree of reflection) and to therefore increase the light yield. To achieve such texturing, the wafer surface is usually etched anisotropically using an alkaline etching solution comprising an additive so that pyramids are etched into the surface. Isopropanol or an isopropanol-free additive is used as an additive to remove silicon such that the surface is formed with pyramids.

Multi-layer solar cells in which several different semiconducting element/compounds are arranged above each other so as to utilize different band gaps of the different semiconducting elements/compounds are known. This results in different levels of absorption of certain wavelength ranges of sunlight. Such multi-layer solar cells are also known as tandem solar cells. Bottom solar cell structures, so-called bottom cells, are to primarily absorb long wavelength ranges of light, while upper solar cell structures, known as top cells, which represent higher cell layers, are to convert short wavelength portions of the light into electric energy. A solar cell structure can be understood as a structure that is able to convert incident light into electric charge carriers that may then be at least partially extracted. Through selective absorption of the individual layers, sunlight can be utilized better overall and can be better converted into electric energy than in the case of single solar cells. This is reflected in the higher efficiency of the tandem solar cell compared to simple (or single) solar cells. Tandem solar cells can also have more than two solar cell structures arranged on top of each other.

A material suitable for the lowest solar cell structure, i.e. the bottom cell, is c-Si, i.e. crystalline silicon, monocrystalline or polycrystalline. A material suitable for the upper solar cell structures (top cells) or next higher solar cell layers above the lowest solar cell structure (bottom cell) include perovskite. Perovskite is deposited on the lower solar cell structure. Various methods are known for depositing perovskite layers, including solution-based deposition processes and vapor-based deposition processes. Examples of common methods of a solution-based deposition of perovskite layers are spin coating and slot die coating. An example of a conventional vapor-based deposition method is co-evaporation.

Vapor-based deposition methods are processes that are based on physical vapor deposition (PVD), chemical vapor deposition (CVD), or atomic layer deposition (0), which generally require a high vacuum. Here, the educts of perovskite are converted into the gas phase, for example by thermal heating, where they react and grow on the surface of the substrate, which can be a c-Si bottom cell, to form the perovskite. The advantages of this vapor-based method are the homogeneous deposition of the layer and a precisely adjustable layer thickness of perovskite. Furthermore, this coating method makes no demands on the surface morphology of the surface on which the deposition takes place, as the perovskite layer can be deposited equally well on smooth and textured surfaces. The disadvantages of these vapor-based methods, on the other hand, are the difficulty in controlling the stoichiometric ratio of the reactants to be vaporized and the associated demanding process control and, on the other hand, the technically complex conditions in a high vacuum. Furthermore, an annealing step (tempering) has to be carried out so as to generate the desired crystallinity of the perovskite. In addition to the limited deposition rate, this step also has a throughput-limiting effect with regard to the commercial implementation. In general, vapor-based deposition methods can be of disadvantage compared to solution-based deposition methods in terms of capital expenditure and throughput.

In solution-based deposition methods, the educts of the perovskite are deposited as a mix in its liquid form directly onto the surface of the bottom cell, wherein the deposited solution then dries under normal pressure and low temperatures, e.g. less than 120° C., and the perovskite is formed. In general, the deposition may be fully or partially solution-based. For example, there are hybrid methods in which one component is deposited in a solution-based way and a further component is deposited by means of evaporation from the gas phase. The advantages of such solution-based methods are process conditions that are technically simple to implement, which may have a positive effect on the costs and further enables the realization of high throughputs. Furthermore, the simple control of the educt composition allows to quickly implement optimizations. The disadvantages of solution-based deposition methods may be the challenge of generating a homogenous layer thickness, which becomes more and more difficult with an increasing substrate size, in addition to handling the educt solutions that may be toxic in part. Furthermore, the homogeneity of the layer thickness may strongly depend on the surface morphology of the surface on which the deposition takes place, since the layer does not grow as a homogeneous layer as in the vapor-based method, but is deposited as a film that may not necessarily be able to equalize morphological irregularities.

To achieve a strong light absorption, which leads to a higher efficiency factor and therefore higher cell efficiencies, the tandem solar cell is usually also provided with a texture that is usually formed on the lower solar cell structure, e.g. the c-Si bottom cell. Such a texture may in turn be generated for the most part in a wet-chemical way by anisotropic etching by means of alkali metal hydroxide solutions containing additives so that pyramid-shaped textures are generated.

US 2009 0 280 597 A1 discloses a smoothing method for a texture surface, wherein edges of pyramid-shaped textures are rounded or smoothed using an alkaline etching bath, however, wherein the material removal is to be small enough that the reflectance of the textured surfaces is not impaired.

US 2018 0 158 976 A1 and US 2021/0126147 A1 disclose solar cells that comprise a combination of a perovskite solar cell and silicon solar cell.

The object of the present invention is to provide methods for generating a textured surface of a semiconductor layer, comprising textures that are suitable for depositing further layers. A further object of the present invention is to provide a method for manufacturing a tandem solar cell comprising such a textured surface, and to provide a corresponding tandem solar cell.

SUMMARY

An embodiment may have a method for generating a textured surface of a semiconductor layer, comprising: anisotropic etching of a surface of a semiconductor layer with a first alkaline etching solution to generate a surface of the semiconductor layer comprising pyramid-shaped textures; and anisotropic etching of the surface comprising the pyramid-shaped textures with a second alkaline etching solution, which differs from the first alkaline etching solution and does not comprise any additive causing the generation of pyramid-shaped structures, to cause material removal of the pyramid-shaped textures, thereby reducing a height difference between peaks and neighboring valleys of the pyramid-shaped textures, wherein, by anisotropic etching with the second alkaline etching solution, the height difference between peaks and neighboring valleys of at least some of the pyramid-shaped textures is reduced by at least 5%, preferably by at least 10%.

Another embodiment may have a method for manufacturing a tandem solar cell, comprising: performing an inventive method for generating a textured surface of a semiconductor layer; generating a first solar cell structure of the tandem solar cell comprising the textured surface; and generating a second solar cell structure of the tandem solar cell on the side of the first solar cell structure on which the textured surface is arranged.

An embodiment may have a tandem solar cell, comprising: a first solar cell structure comprising a semiconductor layer with a textured surface, generated according to the inventive method for generating a textured surface of a semiconductor layer; and a second solar cell structure on the side of the first solar cell structure on which the textured surface is arranged, wherein the textured surface of the semiconductor layer comprises textures comprising a plateau formed by the removal of tips of the pyramid-shaped textures so that a height difference between peaks and neighbouring valleys of the pyramid-shaped texture is reduced by at least 5%, preferably by at least 10%, compared to corresponding textures without removed tips, and/or comprises textures in which an angle between a pyramid face of at least some of the pyramid-shaped textures and a plane of the semiconductor layer is 50° or less so that the height difference between peaks and neighbouring valleys of the pyramid-shaped textures is reduced by at least 5%, preferably by at least 10%, compared to corresponding textures in which an angle between a pyramid face and a plane of the semiconductor layer is approximately 55°.

Embodiments of the invention provide a method for generating a textured surface of a semiconductor layer, comprising: anisotropic etching of a surface of a semiconductor layer with a first alkaline etching solution to generate a surface of the semiconductor layer comprising pyramid-shape textures; and anisotropic etching of the surface comprising the pyramid-shaped textures with a second alkaline etching solution, which differs from the first alkaline etching solution, to cause material removal of the pyramid-shaped textures, thereby reducing a height difference between peaks and neighboring valleys of the pyramid-shaped textures.

Examples of the present invention are based on the finding that by using a second alkaline etching solution that differs from the first alkaline etching solution it is possible to decrease the height of the pyramid-shaped textures generated by using the first alkaline etching solution. This is also referred to herein as an alkaline pyramid cut. This enables rendering the textured surface suitable for a solution-based deposition of subsequent layers. At the same time, however, textures causing a sufficiently low reflectance remain so as to be able to efficiently use the semiconductor layer as a solar cell.

Examples of the present invention provide a method for manufacturing a tandem solar cell, comprising, in addition to a corresponding generation of a textured surface of a semiconductor layer, generating a first solar cell structure of the tandem solar cell comprising the textured surface and generating a second solar cell structure of the tandem solar cell on the side of the first solar cell structure having arranged thereon the textured surface. Such examples make it possible to deposit a perovskite layer in a solution-based manner for generating the second solar cell structure, since, due to the decreased height of the textures, pyramid-shaped structures extending out of the perovskite layer after deposition and therefore causing short circuits can be avoided.

According to the invention, post-treatment (or post-processing) of the pyramid-shaped textures (pyramid cut) is carried out anisotropically in an alkaline environment after isotropic texturing in the alkaline environment, thereby enabling the reduction of the height of the pyramid-shaped textures by means of an alkaline non-toxic etching solution with reduced operational costs.

In examples, post-processing, i.e. anisotropic etching with the second alkaline etching solution, is carried out such that the height difference between peaks and neighboring valleys of at least some of the pyramid-shaped textures is reduced by at least 5%, by at least 10%, or by at least 20%. In examples, the height of the generated pyramid-shaped structures prior to post-processing is in the range of 1 nm to 3 nm. Accordingly, post-processing may carry out material removal resulting in a height reduction of at least 50 nm, at least 100 nm, or at least 200 nm in the case of a pyramid height of 1 μm, of at least 100 nm, at least 200 nm or at least 400 nm in the case of a pyramid height of 2 μm, and of at least 150 nm, at least 300 nm, or at least 600 nm in the case of pyramid height of 3 μm. In examples, material removal (and therefore a height reduction) of at least some of the pyramid-shaped textures by at least 50 nm in a direction perpendicular to a plane of the semiconductor layer may be achieved by means of the pyramid cut. In examples, the overall pyramid structure may be equalized in its height, in particular by reducing the height of pyramid-shaped textures that project further from the plane than others by means of the material removal.

In examples, by etching with the second etching medium, an angle between pyramid faces of at least some of the pyramid-shaped textures and a plane on the semiconductor layer is reduced. In examples, pyramid tips of at least some of the pyramid-shaped textures are removed. The corresponding changes of the shape of the textures may be verified easily by corresponding image recordings or measurements so that the textured surface or tandem solar cells generated by the inventive method differ from tandem solar cells generated with conventional methods. Examples of the present disclosure relate to a correspondingly manufactured tandem solar cell in which the textured surface of the semiconductor layer comprises textures that have been obtained by the post-treatment described herein, i.e. by removal of the tips of pyramid-shaped textures, and comprise correspondingly removed pyramid tips in the form of a plateau or angles between a pyramid phase and a plane of the semiconductor layer of 50° or less.

Examples of the present disclosure provide a tandem solar cell manufactured according to any of the methods described herein, comprising: a first solar cell structure comprising a semiconductor layer with a textured surface; and a second solar cell structure on the side of the first solar cell structure on which the textured surface is arranged, wherein the textured surface of the semiconductor layer comprises textures that comprise a plateau formed by removal of tips of the pyramid-shaped textures so that a height difference between peaks and neighboring valleys of the pyramid-shaped textures is reduced by at least 5%, preferably at least 10%, compared to corresponding textures without their tips removed, and/or comprises textures in which an angle between a pyramid face of at least some of the pyramid-shaped textures and a plane of semiconductor layer is 50° or less so that the height difference between peaks and neighboring valleys of the pyramid-shaped textures is reduced by at least 5%, preferably at least 10%, compared to corresponding textures in which an angle between a pyramid phase and a plane of the semiconductor layer is approximately 55°. Corresponding pyramid-shaped textures are understood to comprise an identical base area.

In examples, a reflectance (reflection factor) of the textured surface for light of a wavelength of 600 nm is 10 to 20% after etching with the second etching solution. Thus, corresponding light with the same or a longer wavelength may effectively enter into the first solar cell structure. Thus, good efficiency may be maintained.

In examples, the second alkaline etching solution is an alkali metal solution. Thus, examples enable the generation of corresponding textures of decreased height by using non-toxic etching solutions in an alkaline environment. In other examples, the second alkaline etching solution is a TMAH etching solution. In examples, the semiconductor layer comprises crystalline silicon, c-Si. In examples, the second solar cell structure comprises perovskite. Examples of the present disclosure therefore enable the generation of tandem solar cells by using well-known materials that enable an effective absorption of light at the respective wavelengths.

In examples, the first alkaline etching solution comprises an additive that is used to generate the pyramid-shaped textures, wherein the second alkaline etching solution does not comprise this additive so that anisotropic removal of material from the pyramid-shaped textures is carried out by post-processing, changing the morphology of the pyramid-shaped textures in order to decrease their height.

In examples, anisotropic etching of the textured surface is carried out under at least one, and preferably all, of the following process conditions: alkali metal hydroxide concentration: 0.01-40 percent by weight; temperature: 15-90° C., preferably 20-80° C., particularly preferably 20-65° C.; etching duration: 3-300 s, preferably 30-300 s, particularly preferably 30-180 s; pH range: 7-14, preferably 9-14. The etching range and the entire etching removal and therefore the height reduction of the pyramid-shaped textures depend on these parameters so that an optimized interaction between the required removal for formation of the structure and economical process times can be achieved.

In examples, prior to anisotropic etching with the first etching medium, the method comprises alkaline etching with a third etching medium for removing sawing damage from the semiconductor layer. Thus, examples enable the preparation of a surface of the lower solar cell structure for depositing the upper solar cell structure by using alkaline media. In examples, after etching with the second etching medium, wet-chemical cleaning of the textured surface takes place so as to prepare the same for further process steps.

In examples, generating the first solar test structure comprises generating a pn-junction in or on the semiconductor layer and generating the second solar cell structure comprises generating a pn-junction, wherein a conductive layer, an electrical contact and/or an electrical insulation is generated between the first and the second solar cell structure. In examples, the generation of the pn-junction of the first solar cell structure is carried out by doping, e.g. by means of gas phase deposition or diffusion. In examples, generating the pn-junction of the second solar cell structure comprises depositing correspondingly doped layers. Herein, a pn-junction is understood to be a direct pn-junction as well as an indirect transition, e.g. having an intrinsic layer therebetween.

In examples, generating the second solar cell structure comprises depositing a perovskite layer by means of at least a partially solution-based method. This may achieve the initially described advantages. The method may be fully solution-based. Alternatively, hybrid methods in which one component of the perovskite is deposited in a solution-based way and a further component is deposited by means of evaporation from the gas phase may be used. In examples, generating a second solar cell structure comprises generating a perovskite absorption layer between an electron transport layer and a hole transport layer. In operation, the perovskite layer absorbs light, resulting in the generation of free electrons and holes.

In examples, the method comprises adjusting the removal caused by etching of the second etching medium by: adjusting a hydroxide concentration in the second etching medium, wherein, at a hydroxide concentration of up to 15 percent by weight, the etching rate increases with an increasing hydroxide concentration, wherein, at a hydroxide concentration of 15 to 25 percent by weight, the etching rate is at a maximum, and wherein, at a hydroxide concentration above 25 percent by weight, the etching rate decreases with an increasing hydroxide concentration; adjusting the temperature, wherein the etching rate increases with an increasing temperature; or adjusting the etching duration, wherein the overall etching removal increases with an increasing etching duration. Thus, by adjusting one or several of the stated parameters, removal of the pyramid-shaped textures may be caused in a process time that is acceptable for practical applications, with said removal being sufficient to avoid short circuits on the one hand, and enabling a sufficiently low reflectance of 10.0 to 25.0 percent at a wavelength of 600 nm, for example.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
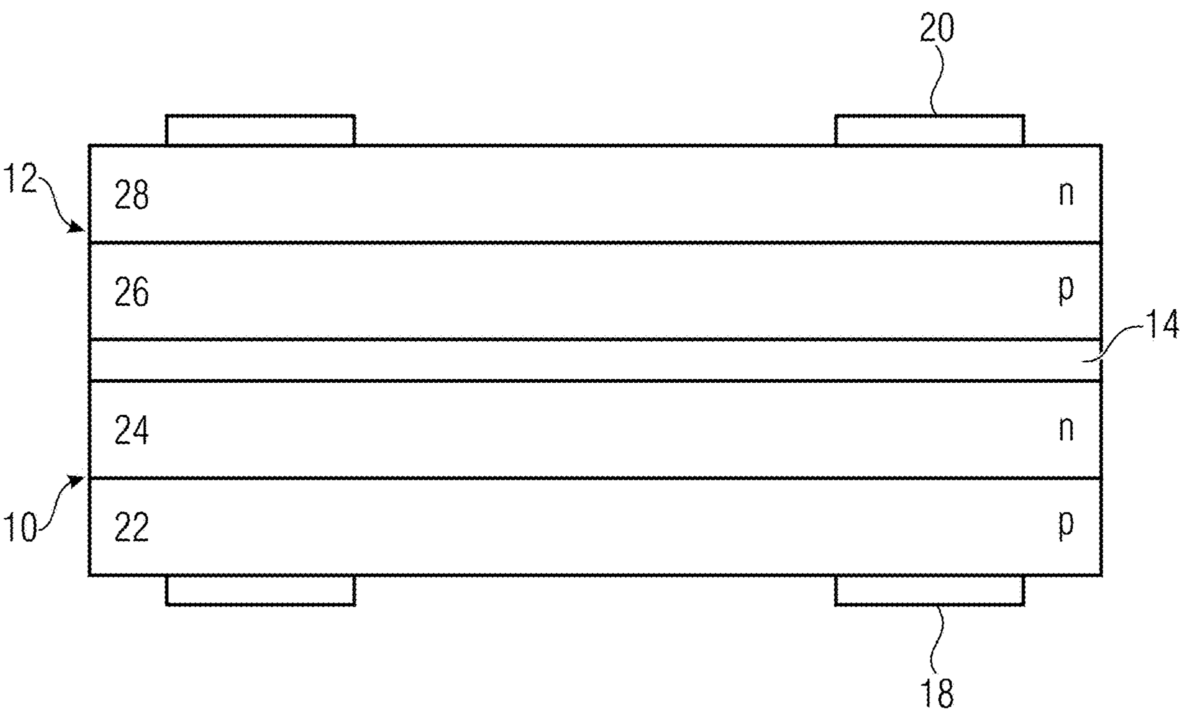
FIG. 1 shows in a purely schematical way a cross-sectional illustration of a tandem solar cell.

In the following, examples of the present disclosure are described in detail and using the accompanying drawings. It is to be noted that the same elements or elements having the same functionality are provided with the same or similar reference numerals, wherein a repeated description of elements provided with the same or similar reference numerals is typically omitted. Descriptions of elements that comprise the same or similar reference numerals are interchangeable. In the following description, many details are described so as to provide a substantial understanding of examples of the disclosure. However, it is obvious to a person skilled in the art that other examples may be implemented without these specific details. Features of the different examples described may be combined, except when features of a corresponding combination exclude each other or such a combination is explicitly excluded.

In the following, examples of the invention are in particular described in connection with the production of tandem solar cells wherein a textured surface of a c-Si layer is generated, on which a perovskite layer is then applied, in particular in a solution-based manner. However, it is to be noted that the semiconductor layer may comprise other materials instead of c-Si, such as germanium or gallium arsenide. Furthermore, it is to be noted that instead of the perovskite layer, a different layer made of a different amorphous or microcrystalline absorber material being able to absorb short-wave parts of light may be used. In examples, further layers are deposited on the textured surface so as to provide a tandem solar cell in which short-circuits maybe avoided in an effective and cost-efficient way through the upper solar cell structure.

FIG. 1 shows in a purely schematic way an example of a tandem solar cell concept to which examples of the present disclosure are applicable. FIG. 1 shows a cross-section of a tandem solar cell with a lower solar cell structure 10, which is usually also referred to as a bottom cell, and an upper solar cell structure 12, which is usually also referred to as a top cell. In examples, the lower solar cell structure 10 is a solar cell based on crystalline silicon (c-Si). In examples, the upper solar cell structure 12 disposed above the lower solar cell structure 10 is a perovskite solar cell deposited using, for example, vapor-based or solution-based coating or deposition processes as described above. In further examples, further solar cell structures (not shown) may be arranged below and/or above the solar cell structures 10, 12. The lower solar cell structure 10 has a hole transport layer 22, which is p-doped, and an electron transport layer 24, which is n-doped. The upper solar cell structure 12 has a hole transport layer 26, which is p-doped, and an electron transport layer 28, which is n-doped. A conductive recombination layer 14 is generally arranged between the solar cell structures 10 and 12. First connection electrodes 18 are formed on the bottom side of the lower solar cell structure 10 and second connection electrodes 20 are formed on the top side of the upper solar cell structure 12. This tandem solar cell concept is purely exemplary, wherein, for example, the arrangement of the individual layers (n and p) can also be reversed, and wherein, for example, a recombination layer can be omitted and instead the top cell and bottom cell are contacted separately and on both sides.

In such a tandem solar cell, the solar cell structures each generate electron-hole pairs independently of one another, wherein the extraction of holes occurs from the connection electrodes 18 of the bottom cell 10 and the extraction of electrons occurs by the connection electrodes 20 from the top cell 12. The rest of the generated charge carriers, electrons from the bottom cell 10 and holes from the top cell 12, can recombine within the tandem solar cell via the recombination layer 14. The recombination layer 14 is usually very thin and transparent so that it does not absorb much light and is conductive so that it enables recombination. The recombination layer may, for example, have one or more layers of indium tin oxide, ITO. Alternatively, instead of the recombination layer, mutually insulated conductive layers may be provided between the lower solar cell structure 10 and the upper solar cell structure 12. These mutually insulated conductive layers may be provided with external terminals to extract the electrons generated by the lower solar cell structure 10 and to extract the holes generated by the upper solar cell structure 12. At this point, it should be noted that the arrangement of the respective electron transport layers and hole transport layers is exemplary and may also be interchanged.

As described above, in order to achieve great light absorption, the lower solar cell structure is usually provided with a texture. Such a texture may in turn be done in a wet-chemical way by anisotropic etching by means of alkali metal hydroxide solutions containing additives so that pyramid-shaped textures are generated. The height (dimension perpendicular to the main plane of the semiconductor layer) of the individual pyramids of the textures may be controlled via the process conditions and may be a height of less than 3 μm, in examples.

Depending on the process and the desired structure of the tandem solar cells, perovskite layers having different thicknesses of between 20 nm and 1000 nm and above may be deposited. For example, solution-based perovskites may typically have a thickness of approximately 500 nm. Consequently, a combination of textured bottom cells and perovskite top cells generated by means of solution-based methods have been hard to realize, since the pyramid tips of the lower solar cells extend through the perovskite layer and may generate electric short circuits (shunts).

Figure 2:
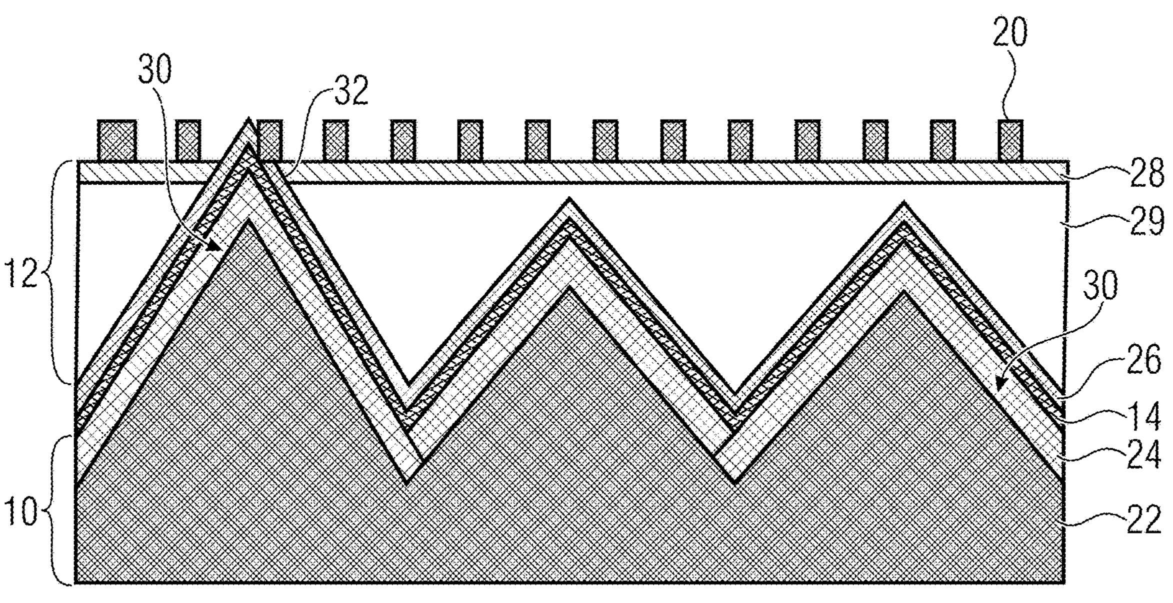
FIGS. 2 and 3 show schematic illustrations of examples of tandem solar cells for describing a short circuit by an upper solar cell structure.

FIG. 2 shows a schematic cross-sectional illustration of a tandem solar cell with a lower c-Si bottom cell and a perovskite top cell 12. Pyramid-shaped textures 30 are formed on the top side of the bottom cell 10. The top cell 12 may be deposited onto the c-Si bottom cell by means of solution-based methods, after generating a recombination layer 14 on the bottom cell 10. In turn, the bottom cell 10 comprises a hole transport layer 22 and an electron transport layer 24. The top cell 12 comprises a hole transport layer 26, an electron transport layer 28, and an electron-hole generation layer 29 (e.g. perovskite). The electron transport layer 24 may consist of C60 and the hole transport layer may consist of Spiro-OMeTAD. The order of these layers may be swapped.

Figure 3:
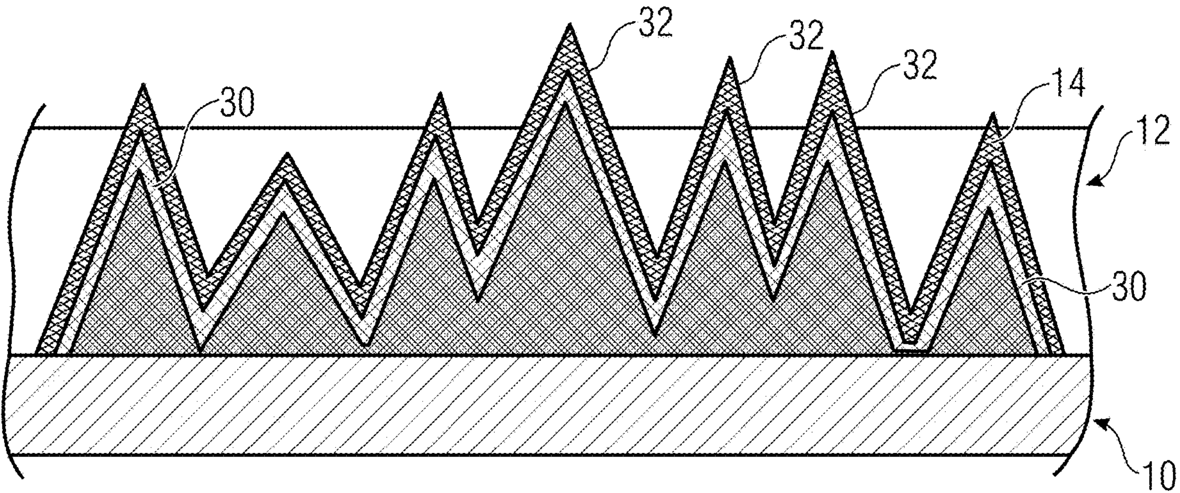

As shown in FIG. 2, one of the pyramid-shaped texture 30 has such a height that it extends through the upper solar cell structure 12 and generates a short circuit (shunt) 32 with terminal electrodes, or metal contacts 20, arranged on the surface of the upper solar cell structure 12. The height of the pyramid-shaped textures may vary after generating them by means of anisotropic etching, as shown in FIG. 3. FIG. 3 also shows in a purely schematic way a cross-sectional illustration of the tandem solar cell of FIG. 2, wherein several pyramid-shaped textures 30 of the bottom cell 10 extend through the top cell 12 and form corresponding short circuits 32.

The problem described above with reference to FIGS. 2 and 3 could be solved by not using any texture or by using a texture of very small pyramids depending on a thickness of the perovskite layer, e.g. <1 μm. A further possibility could be to deposit a textured light-transmissive layer over the perovskite, wherein the layer remains non-textured between the bottom cell and the perovskite. However, these possibilities are associated with a number of disadvantages that would ultimately lead to loss of efficiency of the tandem solar cell. A further possibility would be post-processing the textured surface by means of HF/ozone, which would lead to a rounding of the pyramid tips. However, the same would be too small so that the tips would still extend through the perovskite layer. In this regard, methods have been described in which the pyramid tips and pyramid valleys were rounded off, wherein an angle of the pyramid side faces with respect to the substrate surface is reduced to a size of slightly less than 55° so that the pyramid height is reduced while keeping the base area the same. This is exclusively done by isotropic etching processes that may be carried out in a wet-chemical way, by means of $HF/HNO_3$, by means of reactive ion etching, by means of gas phase etching, or by means of sputter etching. This known method is used in methods in which perovskite is deposited in a vapor-based way, wherein the Gibb-Thompson effect is to be circumvented, and more homogenous layers are to be formed.

Examples of the invention are directed to methods for generating a textured surface of a semiconductor layer and to methods for manufacturing tandem solar cells suitable to prevent the short-circuit problems discussed above. To this end, after being generated, the pyramid-shaped textures are subjected to post-processing, which is also referred to as a pyramid cut.

Figure 4:
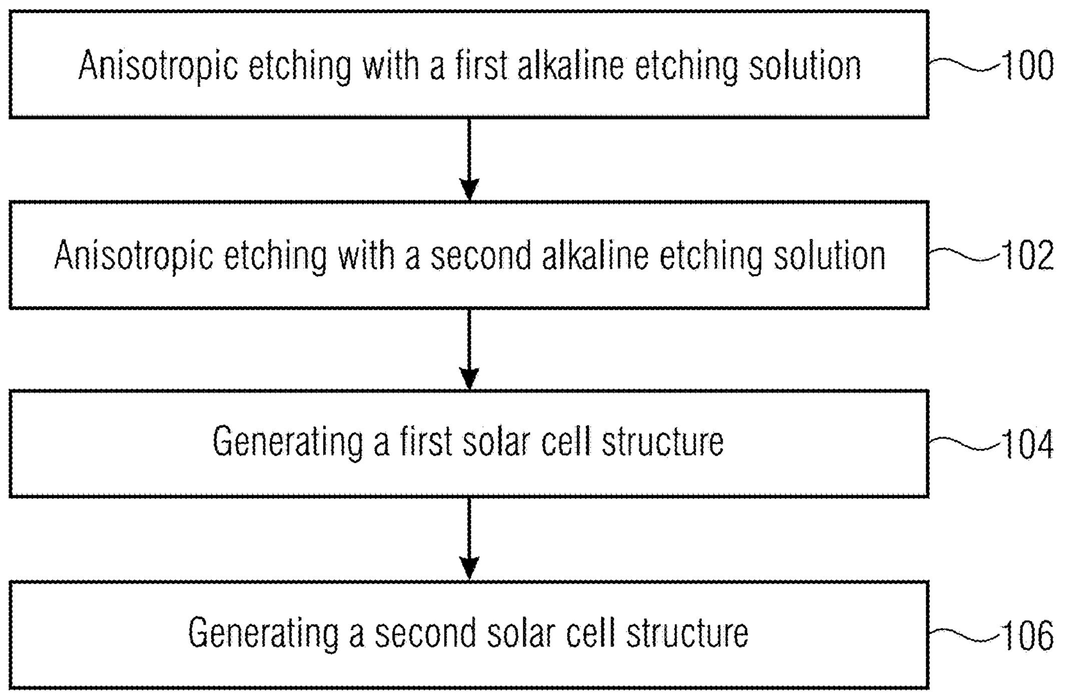
FIG. 4 shows a flow diagram of an example of an inventive method for manufacturing a tandem solar cell.

As shown at 100 in FIG. 4, anisotropic etching with a first alkaline etching solution is first carried out to generate the textured surface, wherein pyramid-shaped textures are anisotropically generated on a semiconductor layer, e.g. a c-Si bottom cell. The pyramid-shaped structures may have a height of <3 μm. An alkali metal solution containing an additive may be used as the first alkaline etching solution. Any known alkaline etching solutions suitable for generating corresponding pyramid-shaped textures on the semiconductor surface may be used as the first alkaline etching solution. In a next step 102, post-processing is also carried out anisotropically by means of a second alkaline etching solution so as to cause material removal of the pyramid-shaped textures. Alkali metal solutions may be used as the second alkaline etching solution, as a polishing approach so to speak. The second alkaline etching solution does not comprise any additives that would cause the generation of pyramid-shaped structures. For example, the composition of the second alkaline etching solution may essentially correspond to that of the first alkaline etching solution, but without the corresponding additive. In examples, due to the post-processing with the second alkaline etching solution, there are one or several of the following changes in the morphology of the pyramids: the tips of the pyramids are removed, the tips of the pyramids are smoothed, the angle of the pyramids is changed, there are plateaus. The core idea of the invention is therefore anisotropic post-processing in an alkaline environment after anisotropic texturing in the alkaline environment. The morphological changes generated by the anisotropic post-processing are herein also referred to as pyramid cuts. Due to the pyramid cuts, similar light absorption properties may be achieved as in conventionally textured surfaces, and the perovskite may be deposited by means of solution-based techniques since the removed/smoothed tips no longer extend through the perovskite, and accordingly, there are no longer any short circuits.

In examples of the invention, after corresponding treatment of the semiconductor layer, a first solar cell structure, a bottom cell, is generated in the semiconductor layer, 104 in FIG. 3. To this end, a pn-junction may be generated in the semiconductor layer by means of doping, e.g. by means of gas-phase deposition or diffusion. To generate the first solar cell structure, an emitter or any other cell layers of the first solar cell structure may be deposited depending on the cell type. In examples, a conductive recombination layer is generated on the textured surface of the first solar cell structure. On the first solar cell structure, a second solar cell structure is then generated, 106 in FIG. 4. Generating the second solar cell structure comprises generating a perovskite layer between a hole transport layer and an electron transport layer. In examples, oppositely doped layers are deposited.

At this point, it is to be noted that any known methods may be used for generating the first solar cell structure, the bottom cell, and for generating the second solar cell structure, the top cell.

Figure 5:
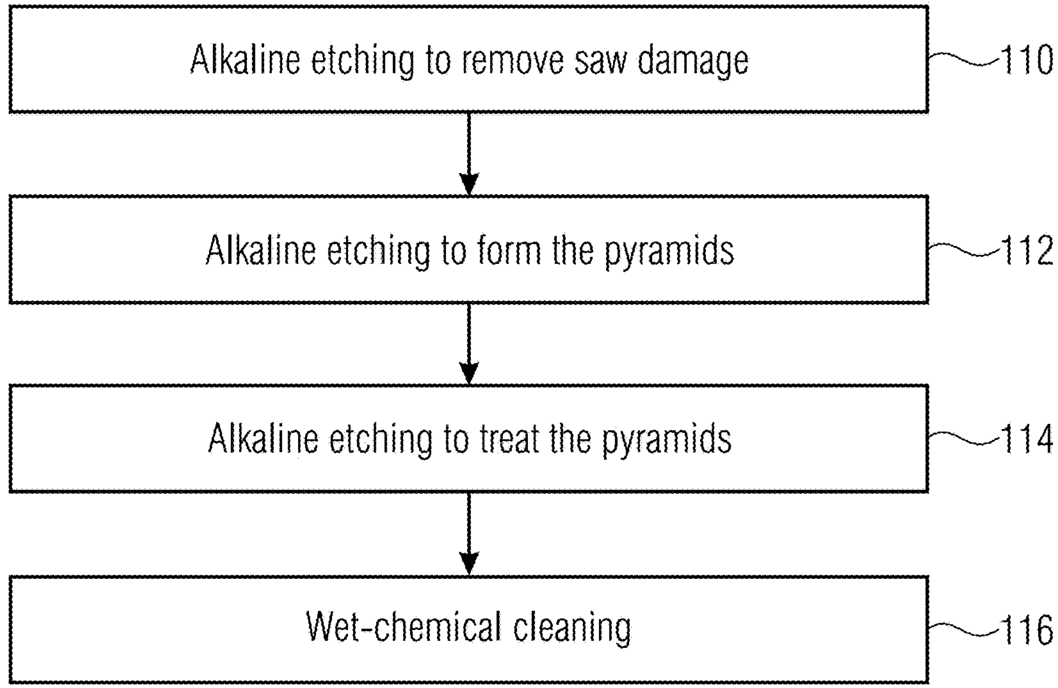
FIG. 5 shows a flow diagram of an example of a method for processing the surface of a semiconductor layer when manufacturing a tandem solar cell.

When manufacturing solar cells, the silicon surface of wafers is changed so as to effectively convert light into electric energy. In this case, monocrystalline silicon wafers may be treated with different etching methods. An example of a process flow for generating a textured surface of a semiconductor layer for manufacturing a tandem solar cell is shown in FIG. 5. In examples, the semiconductor layer is a monocrystalline or a polycrystalline silicon wafer. Silicon wafers are typically sawed from so-called ingots. In order to remove sawing damage created and to generate as planar and homogenous a surface as possible, planarization of the wafer may be carried out in a preparing etching step, wherein the sawing damage of the wafer is removed, step 110 in FIG. 5. This etching is typically carried out in an alkaline environment, using KOH at 70° C. to 90° C. and with treatment times of below 10 minutes. This may effectively remove existing indentations caused by sawing raw silicon. In this case, the wafer is thinned in its entirety, caused by the etching removal, typically between 2 to 6 μm per wafer side.

A consequently created uniform homogeneity of the surface with respect to the smoothness and lack of defects may favor the following etching step 112 for generating pyramid-shaped textures since consistent starting conditions are provided for the following etching medium. Step 112 includes alkaline etching with an alkaline etching solution (first alkaline etching solution) for forming pyramids. The first alkaline etching solution may be KOH (potassium hydroxide) and may contain isopropanol or an isopropanol-free additive as the additive. This removes the silicon to such an extent that pyramids are formed in the surface. In examples, the first alkaline etching solution is a mixture containing long-chain alcohols, wherein the precise compositions are knowledge of the manufacturers. An example for such etching solutions is distributed under the German Trademark "Celltex".

Step 110 of removing sawing damage may also be omitted if the wafer is already available with a smooth surface after a separate previous wafer manufacturing process. In examples, the first etching solution may contain additional additives that enable performing step 112 without the need of step 110.

After generating the pyramid-shaped textures in step 112, alkaline etching for treating the pyramids is carried out in step 114 in FIG. 5, which is done by means of anisotropic etching with a second alkaline etching solution and which is herein referred to as pyramid cut. By means of this additional alkaline etching step, further silicon is selectively removed from the pyramids so that the pyramids comprise a structure and morphology that differs from the original pyramids. In examples, in addition to water, the second alkaline etching solution may comprise just a reactive substance. The reactive substance may be alkali metal hydroxides, such as KOH, NaOH (sodium hydroxide), or TMHA (tetramethylammonium hydroxide).

Subsequently, wet-chemical cleaning steps may be carried out, with said steps not having any etching effect or very little etching effect to so that only atomic layers are removed, however, the pyramid side structure is not changed, step 161 in FIG. 5. Alternatively, post cleaning with a stronger etching effect may be carried out, e.g. using HF or ozone, resulting in a stronger removal, but not changing the textures generated by the pyramid cut with respect to their structure.

Prior and after each of these etching steps, rinsing steps be carried out with water may, such as pre-cleaning prior to step 110 and pre-cleaning/hydrophilization after step 110. If acidic wet-chemical post-cleaning is carried out, such rinsing steps are needed, which is why considerably more water is required for rinsing. In turn, this has a negative impact on operating costs and pollutes the environment, as adhering alkaline residues would lead to partial neutralization and thus to decreased cleaning effectiveness and/or increased acid concentration of a subsequent acidic cleaning step.

After post-cleaning in step 116, further process steps for generating the bottom cell may be carried out, depending on the cell concept. Subsequently, perovskite can be deposited to provide the top solar cell structure. Further process steps required in each case to generate the bottom cell (first solar cell structure) and top cell (second solar cell structure) are known to those skilled in the art. Known processes known such as SC1, pSC1, and SC2 may be used for cleaning. For example, an SC1 method or a pSC1 method may be used for pre-cleaning. For example, the following methods may be used for post-cleaning: SC1+SC2+HF−Dip, pSC1+HF/HCl, $DiO_3$+HF/HCl, HF/HCl+$DiO_3$+HF−Dip, HF/HCl/$O_3$+HF/HCl.

Figure 6A:
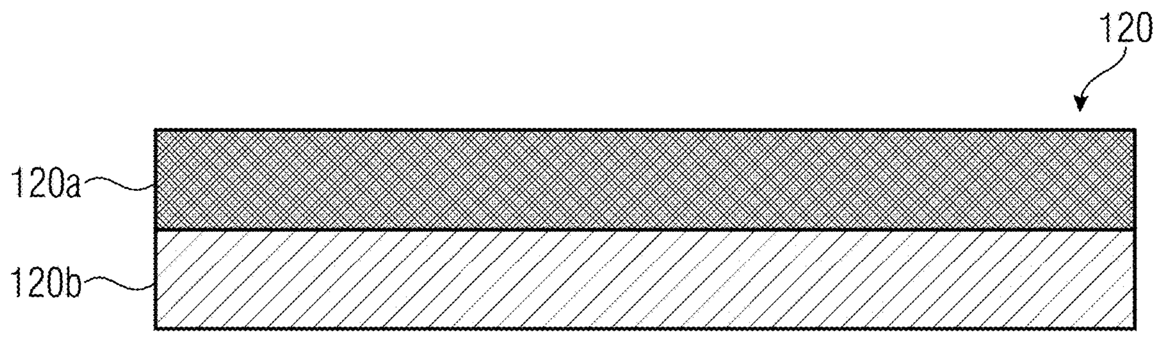
FIGS. 6*a*-6*e* shows schematic cross-sectional illustrations for describing an example of an inventive method.
Figure 6B:
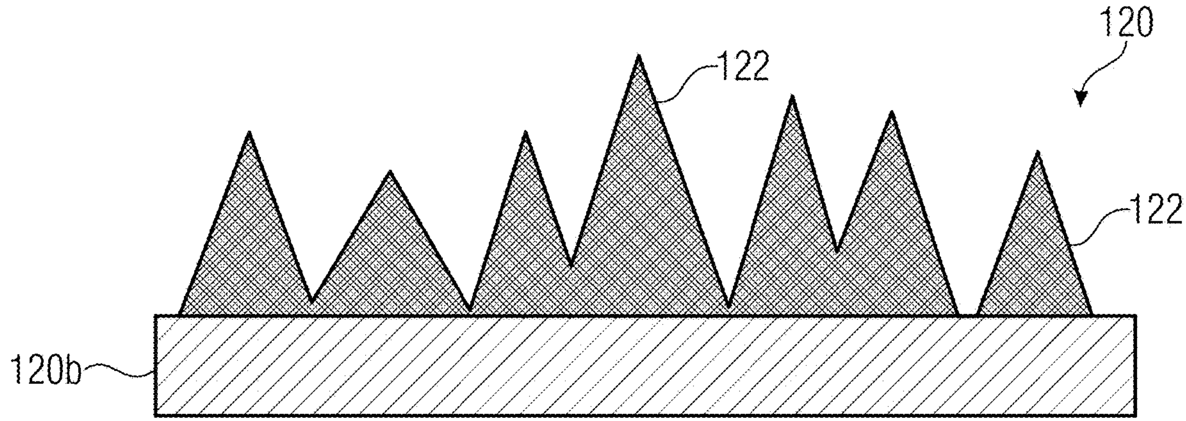
Figure 6C:
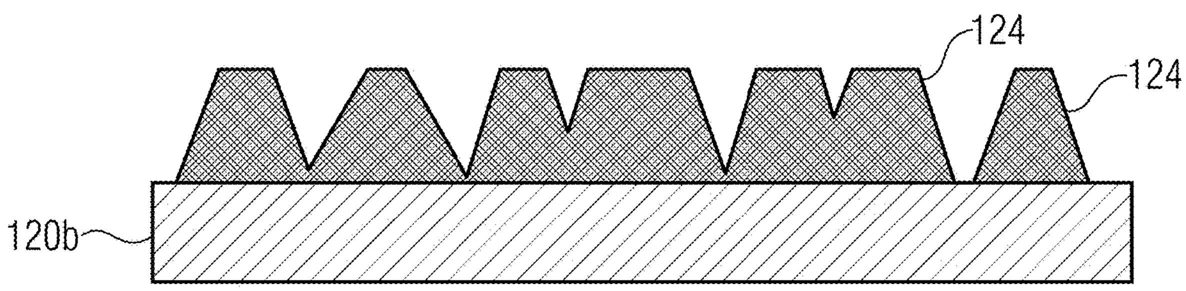
Figure 6D:
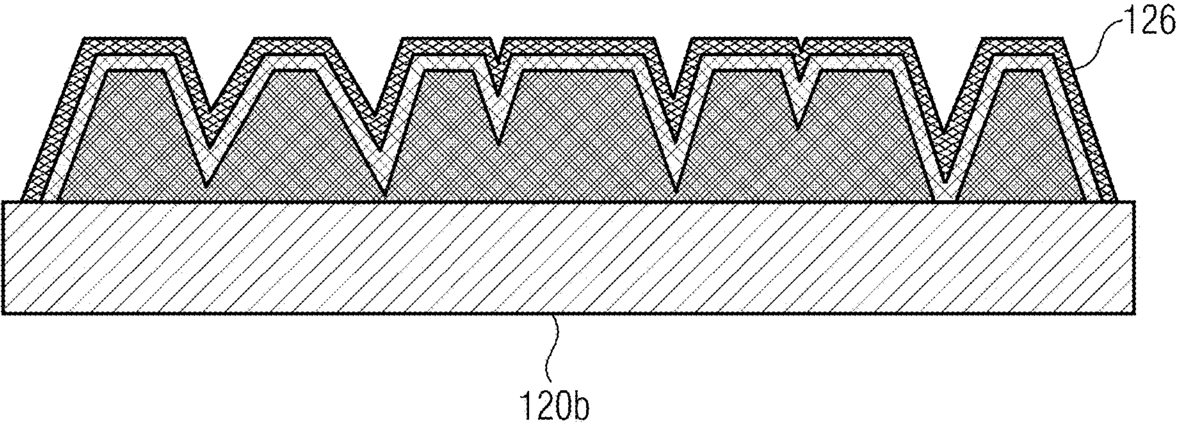
Figure 6E:
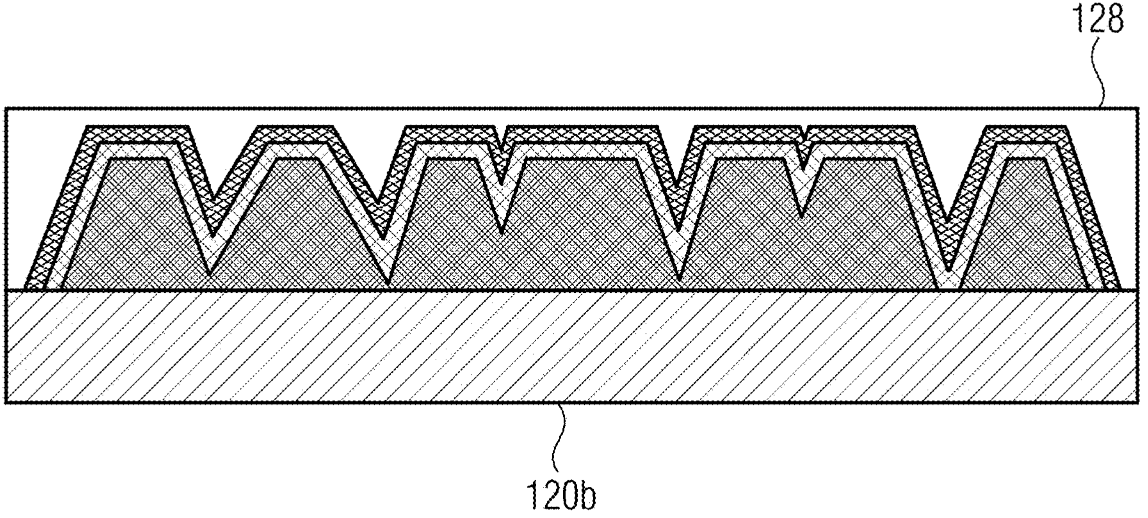

FIGS. 6*a*-*e* show schematic cross-sectional views of structures resulting from carrying out an example of the method disclosed herein. FIG. 6*a* shows a semiconductor layer 120 in the form of a c-Si bulk silicon of the bottom cell, wherein, purely for illustrative purposes, a part 120*a* in which the texturing is generated is shown separately from a part 120*b*. FIG. 6*b* shows the semiconductor layer 120 with pyramid-shaped textures 122 after step 100 in FIGS. 4 and 112 in FIG. 5, respectively. It is to be noted that the height of the pyramid-shaped textures 122 is shown in FIG. 6*b* enlarged compared to a thickness of the part 120*a* in FIG. 6*a*. Starting from the structure shown in FIG. 6*b*, anisotropic etching is performed with a second alkaline etching solution, step 102 in FIG. 2 or step 114 in FIG. 5. This results in truncated pyramid-shaped structures 124 as shown in FIG. 6*c*. Even though only one side of the semiconductor layer is shown textured in the drawings, in examples, anisotropic etching with the second alkaline etching solution generates corresponding textures on both opposing major surfaces of the semiconductor layer or on all sides of the semiconductor layer. Subsequently, various process steps may be carried out for generating the first solar cell structure, which can be different depending on the bottom cell concept. For example, the surface(s) in which textures are generated may be doped in order to create a pn-junction. Furthermore, a recombination layer 126 shown in FIG. 6*d* may be deposited. Following these process steps, the second solar cell structure is generated on a textured side, or one of the two textured sides. For this purpose, a solution-based deposition of, for example, perovskite as a top cell is carried out in examples. A corresponding perovskite layer 128 is shown in FIG. 6*e*. At this point, it should be noted that the perovskite layer 128 in FIG. 6*e* is only shown schematically, without any pn-junctions, which are generated during the generation of the second solar cell structure.

Depending on the respective solar cell concept, different further layers may be provided between the first solar cell structure and the second solar cell structure as well as on the outer surfaces of the structures. For example, light-transmissive electrode layers, such as comprising indium tin oxide, may be provided on the surfaces of the first solar cell structure and the second solar cell structure. The recombination layer provided between the solar cell structures may also comprise indium tin oxide, for example. In this respect, it should be noted that the present disclosure relates in particular to the post-treatment of the generated pyramid-shaped textures, i.e. the pyramid cut, wherein reference may be made to existing solar cells and solar cell concepts with regard to further details of tandem solar cells and tandem solar cell concepts.

In the post-processing step, step 102 in FIG. 4 and step 114 in FIG. 5, the semiconductor, such as silicon, is etched anisotropically. The removal in the post-processing step may be adjusted by variation of the process parameters. For example, by reducing the temperature, a decrease of the reactivity may be observed. In this case, a combination and control of different process parameters may lead to a uniform etching pattern and a uniform treatment of the wafer structure. In examples, the process conditions for the pyramid-cut may be defined as follows: alkali metal hydroxide concentration: 0.01 to 40 percent by weight; temperature: 15 to 90° C., preferably 20 to 80° C., particularly preferably 20 to 65° C.; etching time: 30 to 300 seconds, preferably 30 to 300 seconds, particularly preferably 30 to 180 seconds; pH range 7 to 14, preferably 9 to 14. It has been shown that an optimized interaction between the removal needed for the formation of structures and economical process times can be achieved by adjusting the process conditions accordingly.

For example, the etching rate may be adjusted by adjusting the concentration of the etching medium. If an alkali metal hydroxide is used as the etching medium, at a concentration of 0.01 to around 15 percent by weight, the etching rate increases with an increasing concentration, i.e. the pyramid cut increases. At a concentration of 15 to 25 percent by weight, the etching weight is at a maximum, and at a concentration above 22 percent by weight to 40 percent by weight, the etching weight decreases with an increase in concentration, i.e. the pyramid cut decreases. The higher the temperature, the higher the etching rate, i.e. the stronger the pyramid cut. The longer the etching pattern, the higher the etching rate, i.e. stronger the pyramid cut. By adjusting the respective process conditions, a material removal rate sufficient to prevent peaks of the pyramid-shaped textures from causing a short circuit can be achieved.

The level of the pyramid cut can be determined and adjusted by using surface reflection measurements. The level of the pyramid cut can be adjusted so that a reflection range of the surface texture using the pyramid cut is in a range of 10.0 to 25.0% at a wavelength of 600 nm. Another way to determine the material removal is to measure the pyramid angle. The pyramid angle is the angle of the pyramid side faces to the horizontal substrate surface. The pyramid angle of the pyramid textures prior to the pyramid cut is approximately 55°. Due to the pyramid cut, the pyramid angle can decrease and be in a range from 10 to <55°, preferably from 10 to 50°. Individual pyramids or pyramid valleys can be completely polished so that an angle can be as low as 0°. In order to determine the pyramid angle in each case, the angle between the side surface of the pyramid in question and a line parallel to the main plane of the semiconductor layer of the wafer (which runs through the base of the pyramid) can be determined in cross section. If the side surface of the pyramid is not straight, it can be approximated in cross section by a line connecting the base of the side surface of the pyramid to the highest point of the pyramid.

Figure 7A:
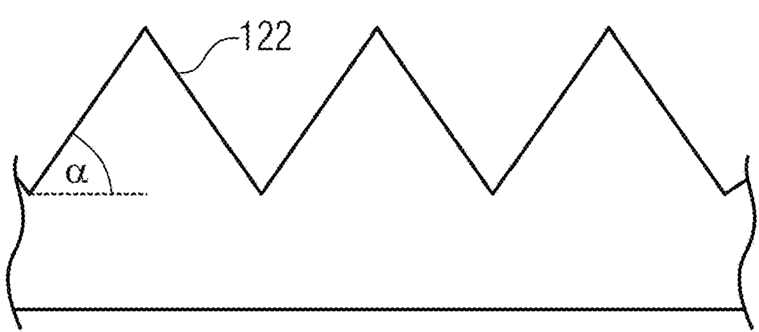
FIGS. 7*a*-7*d* shows schematic cross-sectional illustrations for describing how material removal of the pyramid-shaped textures takes place in examples of the present invention.
Figure 7B:
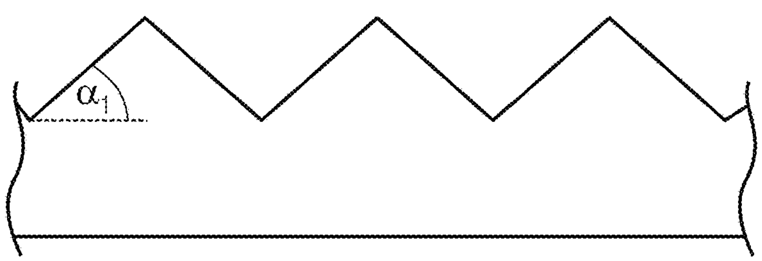
Figure 7C:
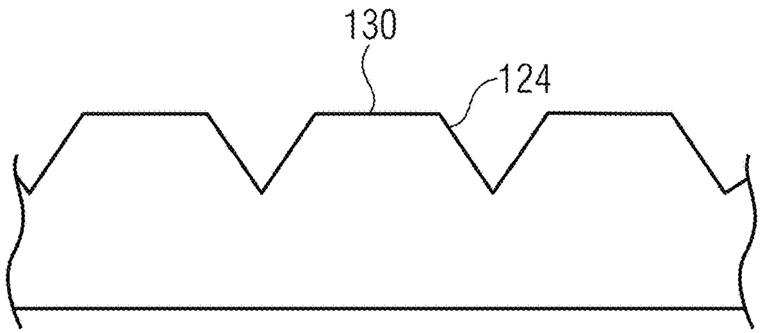
Figure 7D:
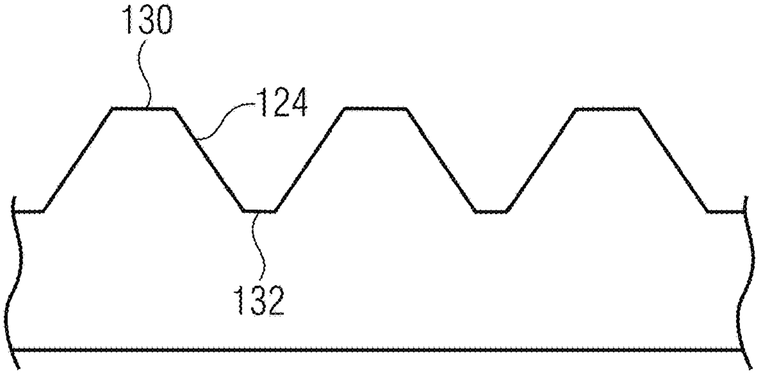

FIGS. 7*b* to 7*d* show possible shapes of the textures obtained by the pyramid cut. FIG. 7*a* shows the initial shape after generating the pyramid-shaped textures by anisotropic etching with the first alkaline etching solution. The pyramid angle $\alpha$ between the side faces of the pyramid and the plane of the semiconductor layers is approximately 55°. In examples, the pyramid cut generates pyramids with a more obtuse angel $\alpha_1$ of <55° or <50°, as shown in FIG. 7*b*. As is shown in FIG. 7*c*, in examples, the pyramid cut generates textures with removed pyramid tips, that is textures 124 having a plateau 134 through removal of the tips of the pyramid-shaped textures 122. The plateaus 130 may be arranged substantially in parallel to the substrate plane. The pyramid angle may be ≤55°. In examples, the pyramid cut can also generate plateaus 132 in valleys between pyramid tips in addition to the removed pyramid tips, at a pyramid angle≤55°, FIG. 7*d*. It should be noted that the plateaus 132 are not generated by filling the valleys, but by increased overall anisotropic removal.

The first etching solution contains an additive that generates pyramid-shaped textures as shown in FIG. 7*a* due to the different etching rates of the crystal planes. The second alkaline etching solution does not contain such an additive so that the etching rates of the crystal planes influenced by the additive in the previous step are directly and exclusively exposed to the second alkaline etching solution (and prevalent reaction product such as silicate) during etching. As a result, material removal of the existing pyramid-shaped textures can be carried out, which changes the shape, structure, and morphology of the pyramid-shaped textures. The shapes shown in FIGS. 7*b* to 7*d* may also exist in parallel and/or as a mixed shape. In any case, the pyramid cut reduces the height of the pyramid-shaped textures to allow material of the second solar cell structure, for example perovskite, to be subsequently deposited by solution-based methods without the risk of short circuits. In examples, to achieve this, the reduction in height difference between peaks and adjacent valleys may at least be 5%, at least 10%, or at least 20%. A corresponding reduction in height may be determined by comparing the textures before and after the pyramid cut, or by comparing the textures after the pyramid cut with respect to a complete pyramid with a pyramid angle of 55°. In other words, a corresponding reduction corresponds to a corresponding difference with respect to a complete pyramid with a pyramid angle as resulting from etching with the first etching solution, e.g. 55°. It is obvious that the sizes and shapes of the pyramid-shaped textures and of the textures subjected to the pyramid cut may be verified without further ado, for example by means of images of cut-through tandem solar cells, by measuring the surface of the textured surface, or by gravimetric analysis.

Anisotropic etching with the second alkaline etching solution causes material removal, which leads to a change in the pyramid structure. In examples, the plateaus formed lead to altered optical properties, in particular to a measurable and noticeable increase in the level of reflection, i.e. reflectivity. The reflectivity may be determined using various optical measuring devices such as a spectrophotometer. For analytical comparability, the difference in reflectivity at a fixed wavelength, such as 600 nm, is typically used. In examples, anisotropic etching with the second alkaline etching solution may cause an increase (absolute) in reflectivity for light of a wavelength of 600 nm of at least 0.5% to 10%, preferably from 1% to 8%, particularly preferably from 2% to 6%. The reflectivity may be determined by means of surface reflection measurements that relate to all portions of the reflected light that consist of diffuse reflection and direct reflection. For example, reflectivity may be measured by using a sphere spectrometer with the designation X-Rite® Ci62 in a SPIN (specular included) measurement mode.

In examples, the second alkaline etching solution is a KOH solution with a KOH concentration of less than 5%. It has been found that a corresponding removal of material in the pyramid cut may be achieved by using such an etching solution, wherein the resulting reduced etching rate may be compensated by increasing the temperature and/or the etching time.

In examples, during etching with the second etching solution, the method may comprise the application of ultrasound to the second etching solution. A corresponding ultrasonic transducer may be provided for this purpose. By using ultrasound, the etching rate during the pyramid cut may be increased, hydrogen bubbles may be destroyed and more homogeneous etching may be achieved in relation to the surface area. The use of ultrasound to support alkaline etching processes is known from U.S. Pat. No. 6,224,713 B1, for example.

Thus, the invention makes it possible to manufacture tandem solar cells in which the bottom cell has a texture and the subsequent deposition process, for example of perovskite, is carried out using solution-based methods without the tips of the pyramid-shaped textures protruding from the deposited perovskite layer. Examples therefore enable solution-based deposition methods of, e.g. perovskite on a c-Si solar cell with a texture surface and the associated solution of short-circuit problems caused by the pyramid tips. This is expected to increase the energy yield of the tandem solar cell. The present invention achieves this through the pyramid cut described, which is a process step following the texturing process and coupled to the texturing process, in which the surface morphology created in the texturing process is changed in such a way that the pyramids generated are either blunted, the pyramid tips are cut off and/or plateaus are formed both in the valleys and on the pyramids. By morphologically altering the original texture using the pyramid cut, it is possible to deposit the next solar cell layer, for example perovskite, using solution-based deposition techniques. This is possible because the modified pyramids, especially the pyramid tips, no longer protrude through the deposited solar cell layer, for example the Perovskite, and therefore do not cause any electrical short-circuits.

Known methods for treating textures are described in J. Du et al., "*Selective rounding for pyramid peaks and valleys improves the performance of SHJ solar cell*", Energy Sci Eng. 2021, 00, 1-7, and L. Mohr et al., "*Numerical Simulation of an Ozone-Based Wet-Chemical Etching*", Industrial & Engineering Chemistry Research, 2020, 59 (40), 17680-17688). In contrast to such known methods in which a treatment (removal) for rounding off pyramids is carried out using HF and ozonized water, examples of the invention make this possible with non-toxic etching agents, which protects the environment, through which fewer cleaning liquids or cleaning steps are required, which reduces operating costs. According to the invention, an anisotropic etching mechanism is used, whereas the mechanism of known solutions is different, where ozone or nitric acid has an oxidizing effect on silicon by forming silicon dioxide, whereupon removal takes place by etching silicon dioxide using hydrofluoric acid, which is an anisotropic etching mechanism and is described as chemical polishing. In the known process, rounding off the tips with a given radius of curvature takes place without a noticeable removal compared to the total height. In contrast, the method according to the invention generates different structures, in particular plateaus, as described with reference to FIGS. 7*c* and 7*d*. According to the invention, a second alkaline etching solution is used for the pyramid cut which enables an etching rate of >50 nm/min. In contrast, with an ozone concentration of 15, 30 or 40 mg/l, etching rates in known acid etching are in a range of 5, 9, or 11 nm/min. In known processes that use $HNO_3$ and HF, porous silicon is formed, which has to be removed in an additional KOH step. This is not necessary in the method according to the invention. The environmental impact of the two toxic components is considered to be a particular disadvantage of the known process. Furthermore, in contrast to the present disclosure, in which the pyramid cut is carried out by means of an alkaline etching solution, two active substances are required here in addition to water. The removal with hydrofluoric acid and ozone is much less pronounced and results in a significant microscopic rounding off of the tips only, without changing the angle and without a noticeable reduction in height. Typical removal rates are 47.7 nm in 10 min (80 ppm ozone, 0.08% HF, 20° C.). The process times are not economical for industrial applications, as high throughputs cannot be achieved in solar cell production. Furthermore, additional production and equipment is required to generate ozone, and the cost of generating such quantities of ozone is enormous, while ozone-resistant materials are also cost intensive. Chemical polishing can also be achieved by using a mixture of nitric acid and hydrofluoric acid. Here, two reactive substances are inevitably required as well, both of which are classified as toxic, wherein the highly exothermic reaction generates nitrogen oxides as a reaction product and leads to environmentally harmful nitrate-containing waste water, combined with increased treatment effort and costs. The method according to the invention therefore enables a time-saving, cost-efficient, and more environmentally friendly way of manufacturing pyramid-shaped textures with a modified morphology and thus preventing short-circuits and tandem solar cells compared to such known methods.

The present invention can be applied to many different application fields, for example all c-Si based solar cell concepts, such as HJT (heterojunction), PERC (passivated emitter rear contact), TOPCON (tunnel oxide passivated contact), etc., on which any solar cell layer suitable for a tandem solar cell concept may be deposited.

Examples of the present disclosure relate in particular to the generation of a textured surface of a semiconductor layer, wherein the pyramid-cut step according to the invention differs from conventional post-cleaning processes, as carried out in conventional processes after each chemical treatment step. For example, the wafer surfaces are cleaned with deionized water after each chemical treatment step. Other contaminants such as metallic impurities may be effectively removed with mixtures of water, hydrochloric acid and/or hydrofluoric acid. Ozone may also be added to the mixtures, as ozone has a high oxidation potential. Organic contaminants may preferably be removed with mixtures of hydrogen peroxide and/or alkaline media, such as ammonia, hypochlorite solutions, or ozone. Ozone has a low resistance in an alkaline environment, wherein an acid is preferably added the ozone, particularly preferably hydrochloric acid (HCl) and/or hydrofluoric acid (HF). The addition of acid to ozonized water may also achieve cleaning of metallic impurities. However, such cleaning processes do not remove sufficient etching to change the pyramid-shaped structure of the silicon wafer.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus. Some or all of the method steps may be performed by a hardware apparatus (or using a hardware apparatus) such as a microprocessor, a programmable computer, or an electronic circuit. In some embodiments, some or several of the method steps may be executed by such an apparatus. Depending on certain implementation requirements, embodiments of the invention may be implemented in hardware or software, or may be at least partially implemented in hardware or software.

In the foregoing Detailed Description, various features are grouped together in examples for the purpose of streamlining the disclosure. This method of disclosure is not to be interpreted as reflecting an intention that the claimed examples comprise more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although dependent claims may refer in the claims to a specific combination with one or more other claims, other examples may also include a combination of dependent claims with the subject matter of each other dependent claim or a combination of each feature with other dependent or independent claims. Such combinations shall be included herein unless it is stated that a specific combination is not intended. Furthermore, it is intended to include also a combination of features of a claim with any other independent claim even if this claim is not directly made dependent to the independent claim.

The above-described examples merely represent the basic principles of the present invention. It is understood that other persons skilled in the art will appreciate modifications and variations of the arrangements and details described herein. This is why it is intended that the invention be limited only by the scope of the following claims rather than by the specific details that have been presented herein by means of the description and the discussion of the embodiments.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for generating a textured surface of a semiconductor layer, comprising:
- anisotropic etching of a surface of a semiconductor layer with a first alkaline etching solution to generate a surface of the semiconductor layer comprising pyramid-shaped textures; and
- anisotropic etching of the surface comprising the pyramid-shaped textures with a second alkaline etching solution, which differs from the first alkaline etching solution and does not comprise any additive causing the generation of pyramid-shaped structures, to cause material removal of the pyramid-shaped textures, thereby reducing a height difference between peaks and neighboring valleys of the pyramid-shaped textures;
- wherein, by anisotropic etching with the second alkaline etching solution, the height difference between peaks and neighboring valleys of at least some of the pyramid-shaped textures is reduced by at least 5%, preferably by at least 10%.

2. The method according to claim 1, wherein, by anisotropic etching with the second alkaline etching solution, the reflectivity of the surface of the semiconductor layer comprising the textures is increased for light of a wavelength of 600 nm by 0.5% to 10% in absolute terms, preferably by 1% to 8% in absolute terms, particularly preferably by 2% to 6% in absolute terms.

3. The method according to claim 1, wherein, by etching with the second etching solution, an angle between pyramid faces of at least some of the pyramid-shaped textures and a plane of the semiconductor layer is reduced, and/or pyramid tips of at least some of the pyramid-shaped textures are removed.

4. The method according to claim 1, wherein, after etching with the second etching solution, a degree of reflection of the textured surface is 10% to 25% for light of a wavelength of 600 nm.

5. The method according to claim 1, the second alkaline etching solution is an alkali metal solution, an alkaline earth metal solution or a TMAH etching solution.

6. The method according to claim 1, wherein the semiconductor layer comprises crystalline silicon.

7. The method according to claim 1, wherein anisotropic etching of the surface comprising the pyramid-shaped textures is carried out under at least one of the following process conditions:
- alkali metal hydroxide concentration: 0.01-40 percent by weight,
- temperature: 15-90° C., preferably 20-80° C., particularly preferably 20-65° C.
- etching duration: 3-300 s, preferably 30-300 s, particularly preferably 30-180 s;
- pH range: 7-14, preferably 9-14.

8. The method according to claim 1, comprising, prior to anisotropic etching with the first etching solution, alkaline etching with a third etching medium for removing sawing damage from the semiconductor layer.

9. The method according to claim 1, comprising, after etching with the second etching solution, wet-chemical cleaning of the textured surface.

10. The method according to claim 1, further comprising adjusting the removal caused by etching with the second etching solution by at least one of:
- adjusting a potassium hydroxide concentration in the second etching solution, wherein, at a hydroxide concentration of up to 15 percent by weight, the etching rate increases with increasing hydroxide concentration, from 15 to 20 percent by weight, the etching rate is at its maximum, and, at a hydroxide concentration above 25 percent by weight, the etching rate decreases with increasing hydroxide concentration,
- adjusting the temperature, wherein the etching rate increases as the temperature rises, or
- adjusting the etching duration, wherein the total etching removal increases with increasing etching duration.

11. The method according to claim 1, comprising applying ultrasound to the second etching solution during etching with the second etching solution.

12. A method for manufacturing a tandem solar cell, comprising:
- performing a method for generating a textured surface of a semiconductor layer, comprising:
  - anisotropic etching of a surface of a semiconductor layer with a first alkaline etching solution to generate a surface of the semiconductor layer comprising pyramid-shaped textures; and
  - anisotropic etching of the surface comprising the pyramid-shaped textures with a second alkaline etching solution, which differs from the first alkaline etching solution and does not comprise any additive causing the generation of pyramid-shaped structures, to cause material removal of the pyramid-shaped textures, thereby reducing a height difference between peaks and neighboring valleys of the pyramid-shaped textures;
  - wherein, by anisotropic etching with the second alkaline etching solution, the height difference between peaks and neighboring valleys of at least some of the pyramid-shaped textures is reduced by at least 5%, preferably by at least 10%; and
- generating a first solar cell structure of the tandem solar cell comprising the textured surface; and
- generating a second solar cell structure of the tandem solar cell on the side of the first solar cell structure on which the textured surface is arranged.

13. The method according to claim 12, wherein generating the first solar cell structure comprises generating a pn-junction in or on the semiconductor layer, wherein generating the second solar cell structure comprises generating a pn-junction, wherein a conductive layer, an electrical contact, and/or an electrical insulation is generated between the first and the second solar cell structure.

14. The method according to claim 12, wherein the second solar cell structure comprises a perovskite layer.

15. The method according to claim 14, comprising depositing the perovskite layer by means of an at least partially solution-based method.

* * * * *